United States Patent
Suzuki et al.

(10) Patent No.: US 9,252,078 B2
(45) Date of Patent: Feb. 2, 2016

(54) SEMICONDUCTOR DEVICE

(71) Applicant: FUJITSU LIMITED, Kawasaki-shi, Kanagawa (JP)

(72) Inventors: Toshihide Suzuki, Zama (JP); Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/172,020

(22) Filed: Feb. 4, 2014

(65) Prior Publication Data

US 2014/0284804 A1 Sep. 25, 2014

(30) Foreign Application Priority Data

Mar. 25, 2013 (JP) ................. 2013-062777

(51) Int. Cl.
*H01L 23/34* (2006.01)
*H01L 23/48* (2006.01)
*H01L 23/522* (2006.01)
*H01L 23/66* (2006.01)

(52) U.S. Cl.
CPC .......... *H01L 23/481* (2013.01); *H01L 23/5223* (2013.01); *H01L 23/5225* (2013.01); *H01L 23/66* (2013.01); *H01L 2924/0002* (2013.01)

(58) Field of Classification Search
CPC ... H01L 23/5223; H01L 23/481; H01L 23/66; H01L 23/5225
USPC ....................................... 257/728
See application file for complete search history.

(56) References Cited

U.S. PATENT DOCUMENTS

2003/0141501 A1 7/2003 Komurasaki
2004/0257179 A1 12/2004 Dov et al.
2005/0184825 A1* 8/2005 Oran ............................. 333/33

FOREIGN PATENT DOCUMENTS

JP 2003-224189 A1 8/2003
TW 480813 3/2002

OTHER PUBLICATIONS

Extended European Search Report dated Jul. 7, 2014 issued in counterpart application No. 14153568.2.
Office Action of Taiwan (R.O.C.) Patent Application No. 103105794 dated Apr. 21, 2015. Full Translation of the Office Action.
Office Action of corresponding TW (R.O.C.) Patent Application No. 103105794 dated Aug. 28, 2015. Full Translation of the Office Action.

* cited by examiner

*Primary Examiner* — Nicholas Tobergte
(74) *Attorney, Agent, or Firm* — Kratz, Quintos & Hanson, LLP (57) ABSTRACT

A semiconductor device includes a first electrode formed on a substrate, the first electrode being a first electrical potential; and a second electrode formed on the first electrode, the second electrode including a signal wiring that transmits a signal and a planar electrode part with a prescribed area. A shape of the first electrode corresponding to the planar electrode part is made into a slit shape such that a longitudinal direction of a slit is parallel to a direction in which the signal proceeds in the planar electrode part.

9 Claims, 8 Drawing Sheets

FIG. 8

SEMICONDUCTOR DEVICE

CROSS-REFERENCE TO RELATED APPLICATION

This application is based upon and claims the benefit of priority of the prior Japanese Patent Application No. 2013-062777, filed on Mar. 25, 2013, the entire contents of which are incorporated herein by reference.

FIELD

The embodiments discussed herein are related to a semiconductor device.

BACKGROUND

In recent years, a semiconductor device that processes an ultra-high frequency signal of a millimeter-wave and the like may been put in practical use. In such a case, the wavelength of a signal (radio frequency (RF) signal) becomes short as the operating frequency of the signal becomes high.

Apart from that, in a semiconductor device (semiconductor integrated circuit or LSI chip) on which a high frequency circuit such as an amplifier is mounted, e.g., when a chip (semiconductor substrate) is thicker than one-fourth (¼) of a signal wavelength that is used, a resonant mode occurs between the rear face of the chip and the circuit pattern of a front face.

In other words, in the case of an amplifying circuit, it is known that an output signal is fed back to an input terminal due to a resonance, which causes a problem such as an oscillation. Even if an oscillation does not occur, there may arise a problem, e.g., that a band characteristic deteriorates at a resonant frequency.

As mentioned above, e.g., in the semiconductor device including the amplifying circuit, the output signal is fed back to the input terminal due to the resonance, which causes the oscillation or the deterioration of the band characteristic or the like.

For that reason, e.g., it may be considered that a multilayer wiring structure is used, in which a ground plane (GND shield) is arranged in a lower layer so that a substrate is shielded from a signal electrode (pad electrode) in order to establish a structure that prevents an RF signal from leaking to the substrate.

However, when the GND shield is arranged in the lower layer of the pad electrode, e.g., the deterioration of a high frequency characteristic will be caused by a capacitance between the pad electrode and the GND shield.

Now, in a related semiconductor device that uses a high frequency signal, an idea may been proposed in order to reduce high frequency loss in a pad electrode and the like.

Patent Document 1: Japanese Laid-open Patent Publication No. 2003-224189

SUMMARY

According to an aspect of the embodiments, a semiconductor device includes a first electrode formed on a substrate, the first electrode being a first electrical potential; and a second electrode formed on the first electrode, the second electrode including a signal wiring that transmits a signal and a planar electrode part with a prescribed area.

A shape of the first electrode corresponding to the planar electrode part is made into a slit shape such that a longitudinal direction of a slit is parallel to a direction in which the signal proceeds in the planar electrode part.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, before describing the embodiments of a semiconductor device in detail, an example of the semiconductor device and its problems will be described with reference to FIG. 1 to FIG. 4B.

Figure 1:
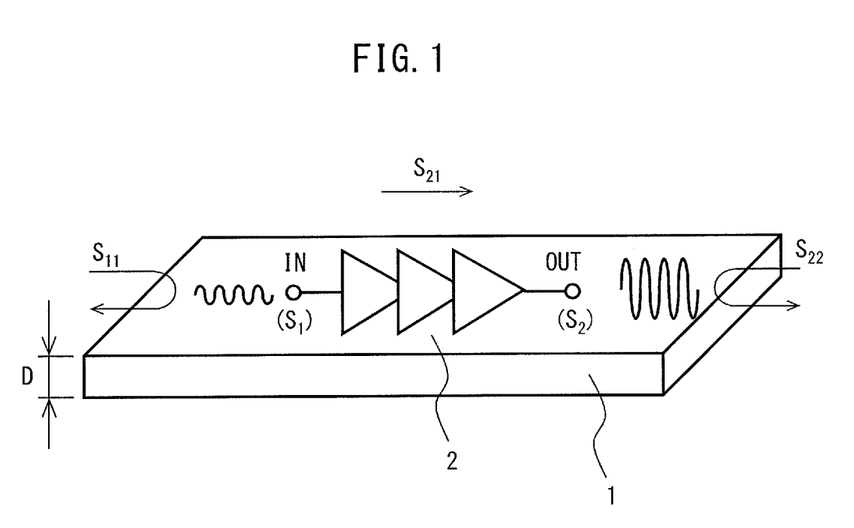
FIG. 1 is a schematic diagram depicting an example of a semiconductor device.
Figure 2A:
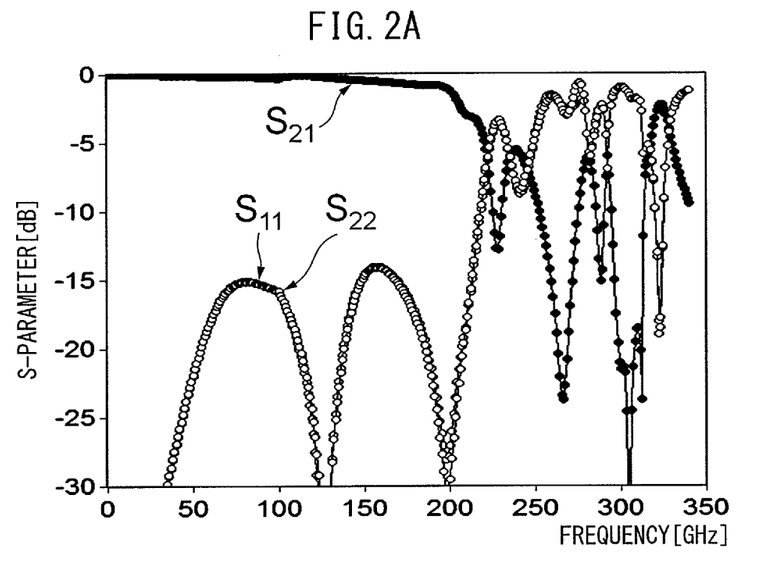
FIGS. 2A and 2B depict examples of the dependence of each S-parameter vs. frequency for different substrate thicknesses in the semiconductor device depicted in FIG. 1.
Figure 2B:
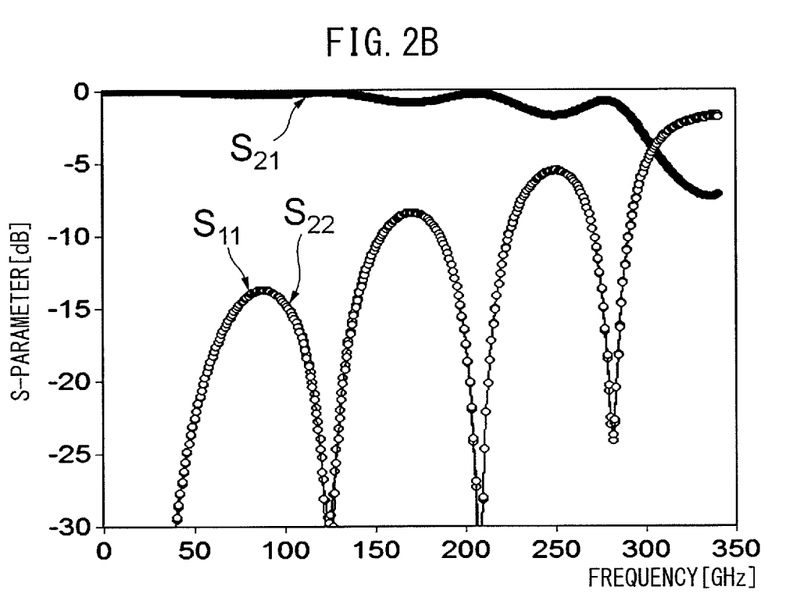

FIG. 1 is a schematic diagram depicting an example of a semiconductor device. FIGS. 2A and 2B depict examples of the dependence of S-parameter vs. frequency for different substrate thicknesses in the semiconductor device depicted in FIG. 1. FIGS. 2A and 2B depict simulation results for the substrate thickness of 100 μm and of 50 μm, respectively.

In FIG. 1, reference sign 1 denotes a substrate (semiconductor substrate), reference sign 2 denotes an amplifier, and reference sign D denotes a substrate thickness. Assuming that an input IN of the amplifier 2 is $S_1$ and an output OUT of the amplifier 2 is $S_2$ in FIG. 1, S-parameters (Scattering parameters) $S_{11}$, $S_{22}$ and $S_{21}$ are defined as follows.

$S_{11}$ represents an S-parameter which is detected (reflected) from the input IN for an incidence to the input IN, $S_{22}$ represents an S-parameter which is detected from the output OUT for an incidence to the output OUT, and $S_{21}$ represents an S-parameter which is detected from the output OUT for an incidence to the input IN.

Although one wavelength of a signal in a semiconductor device depends on, e.g., a material used as the substrate 1 (e.g., a type of a compound semiconductor), an impurity concentration, the characteristic of an surface (interface) and the like in a region where the signal passes, a simulation was performed by assuming the relative dielectric constant of 11 as an example. Accordingly, the quarter wavelength of a 300-GHz signal on the substrate 1 is found to be $3\times10^{14}/3\times10^{11}/4/11^{1/2} \cong 75.5$ [μm].

First, as depicted in FIG. 2A, when the thickness of the substrate 1 is 100 μm, both of the S-parameter $S_{11}$ representing the reflection of the input and the S-parameter $S_{22}$ representing the reflection of the output increase abruptly, e.g., at around a frequency exceeding 200 GHz.

On the other hand, the S-parameter $S_{21}$ representing the passage of a signal through the semiconductor device, in which the signal input into the input IN is amplified by the amplifier 2 and is output from the output OUT, begins to decrease, e.g., at around a frequency exceeding 200 GHz, and becomes smaller than the S-parameters $S_{11}$ and $S_{22}$ at around 220 GHz.

Furthermore, the S-parameter $S_{21}$ temporarily becomes larger than the S-parameters $S_{11}$ and $S_{22}$, e.g., at around 240 GHz, but may be a minimum value (−30 dB) at around 300 GHz, indicating that the signal may hardly pass through the semiconductor device. Accordingly, when the thickness D of the substrate 1 is 100 μm, it is difficult to use the semiconductor device up to 300 GHz, and a use frequency will be almost restricted to 200 GHz or less.

Next, as depicted in FIG. 2B, when the thickness D of the substrate 1 is 50 μm, the S-parameters $S_{11}$ and $S_{22}$ increase, e.g., as the frequency becomes high, and become larger than the S-parameter $S_{21}$ at frequencies exceeding 300 GHz.

In addition, the S-parameter $S_{21}$ varies so that it exhibits an opposite characteristic for a frequency change as compared to those of the S-parameters $S_{11}$ and $S_{22}$, and becomes smaller than the S-parameters $S_{11}$ and $S_{22}$ at frequencies exceeding about 300 GHz, as mentioned above. Accordingly, the semiconductor device is usable up to about 300 GHz, but its characteristic deteriorates due to large reflection at frequencies exceeding 300 GHz.

Thus, it is understandable that large reflection makes it difficult to use the semiconductor device when the thickness D of the substrate 1 is larger than one-fourth of a signal wavelength that is used. Conceivably, this is because a resonant mode occurs between a rear face of the substrate 1 and a circuit pattern of a front face thereof, which causes problems such as an oscillation and the deterioration of a band characteristic.

Now, when the thickness D of the substrate 1 is thinned, not only the mechanical strength of the substrate deteriorates, but also the level of manufacturing difficulty for thinning the substrate rises, causing the increase of a manufacturing cost. Accordingly, it is considered that a microstripline structure is applied, e.g., in which shielding is performed by a ground wiring.

Figure 3A:
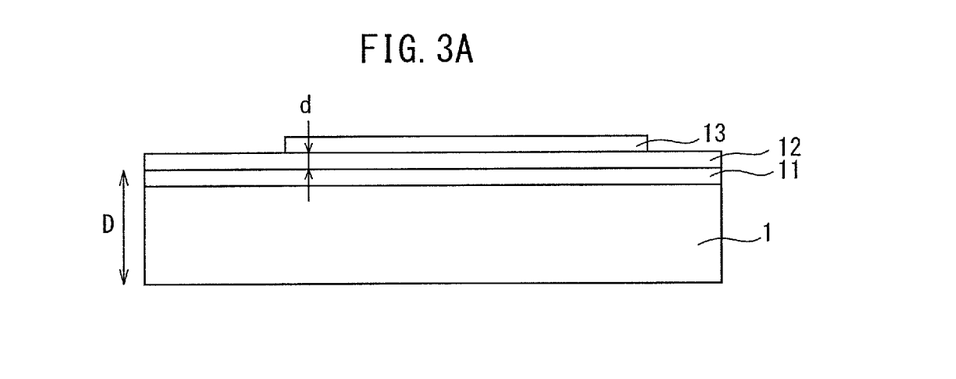
FIGS. 3A and 3B are explanatory diagrams for a microstripline structure in a semiconductor device.
Figure 3B:
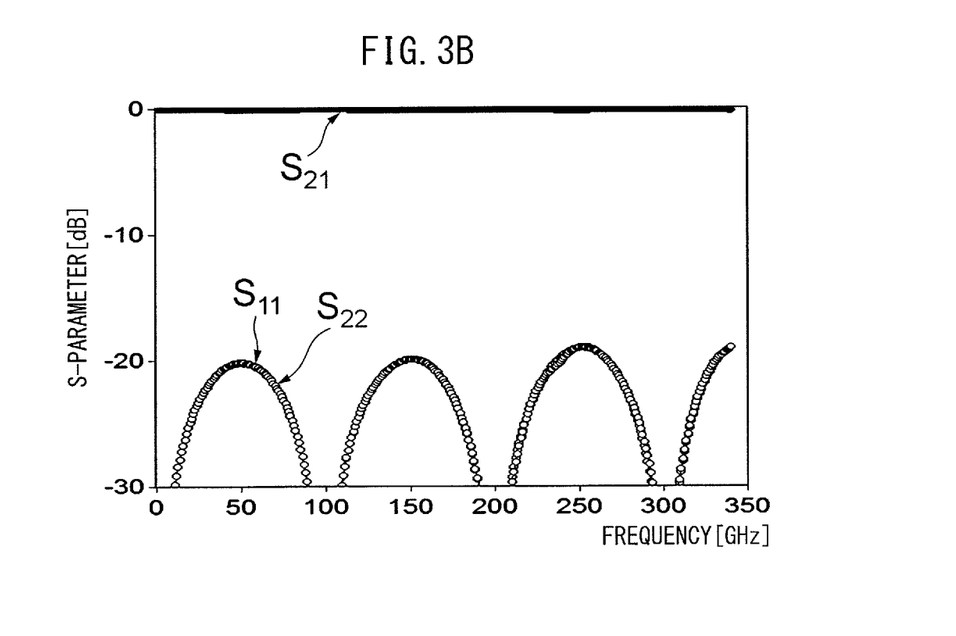

FIGS. 3A and 3B are explanatory diagrams for a microstripline structure in a semiconductor device. FIG. 3A depicts a cross section of a microstripline structure, and FIG. 3B depicts an example of the dependence of each S-parameter vs. frequency in the microstripline structure depicted in FIG. 3A.

In FIG. 3A, reference sign 1 denotes a substrate, reference sign 11 denotes a ground wiring (GND shield), reference sign 12 denotes an insulating layer, and reference sign 13 denotes a signal wiring.

As depicted in FIG. 3A, in the microstripline structure, the ground wiring (GND shield) 11, on which a ground (GND) electrical potential is applied by a metal wiring layer, is formed on the substrate 1.

Furthermore, the signal wiring 13 by a metal wiring layer is formed on the GND shield 11 via the insulating layer 12. A distance between the GND shield 11 and the signal wiring 13, i.e., the thickness d of the insulating layer 12, is about 1 μm, and the thickness D of the substrate 1 is about 100 μm.

As depicted in FIG. 3B, in the microstripline structure depicted in FIG. 3A, it is understandable that the S-parameter $S_{12}$, which represents the passage of a signal through the semiconductor device, hardly decreases and maintains 0 dB even when the frequency increases and, e.g., exceeds 300 GHz.

Although the S-parameters $S_{11}$ and $S_{22}$, which represent the reflection of the input and the output respectively, vary, e.g., in a range between −20 dB and −30 dB with the period of about 100 GHz, the S-parameters do not increase drastically. In other words, it is understandable that the microstripline structure enables a good signal transmission even for a signal with a frequency exceeding 300 GHz.

Figure 4A:
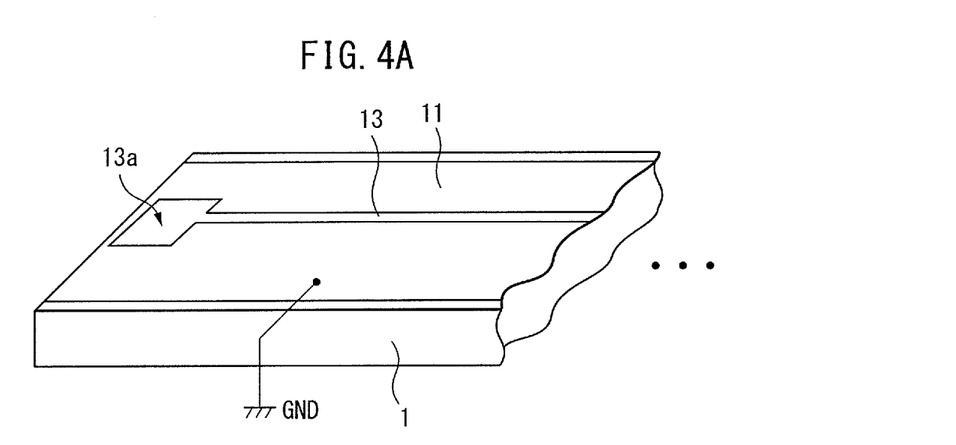
FIGS. 4A and 4B are explanatory diagrams for a GND shield in a semiconductor device.
Figure 4B:
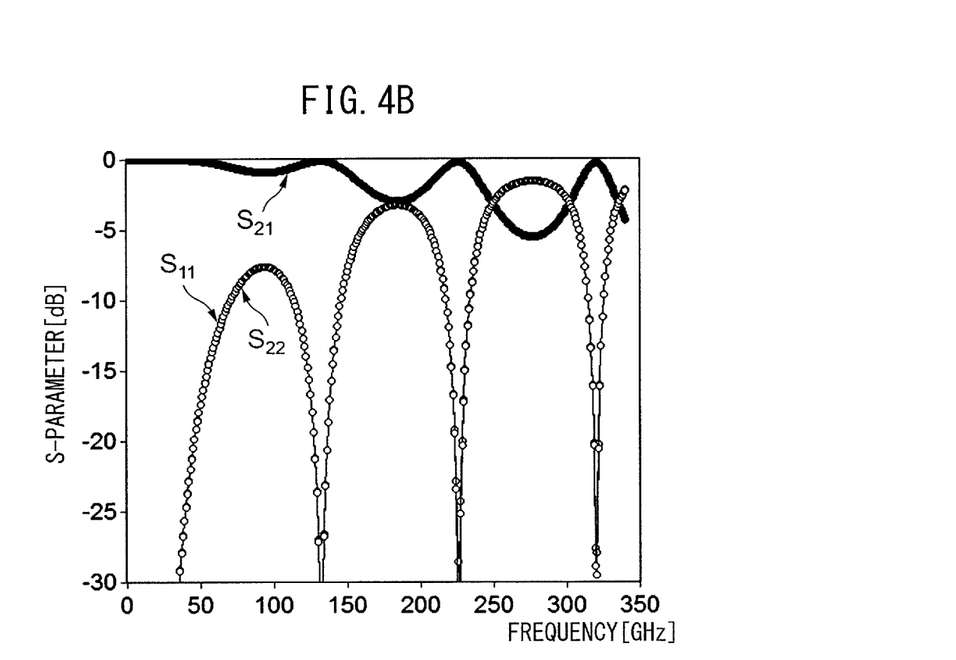

FIGS. 4A and 4B are explanatory diagrams for a GND shield structure in a semiconductor device. FIG. 4A depicts a perspective view, and FIG. 4B depicts an example of the dependence of each S-parameter vs. frequency in the GND structure depicted in FIG. 4A. Note that FIG. 4A depicts a part (end part) of the substrate 1.

As depicted in FIG. 4A, in the GND shield structure, a GND shield 11, on which a GND electrical potential is applied by a metal wiring, is formed on a substrate 1, in a similar manner to that of the microstripline structure of FIG. 3A mentioned above.

Furthermore, a signal wiring 13 by a metal wiring layer is formed on the GND shield 11 via an insulating layer 12. A distance between the GND shield 11 and the signal wiring 13, i.e. the thickness d of the insulating layer, is about 1 μm, and the thickness D of the substrate 1 is about 100 μm.

Now, in a semiconductor device, e.g., a planar electrode part (pad electrode) 13a, which may be an area of a certain size for an input/output pad and the like, is typically formed on the end part of the signal wiring 13. Since the pad electrode 13a like this faces the GND shield 11 via the insulating layer 12, a capacitance is to be formed.

Accordingly, as depicted in FIG. 4B, in the GND shield structure depicted in FIG. 4A, e.g., the S-parameter $S_{21}$ almost coincides with the S-parameters $S_{11}$, $S_{22}$ at around 180 GHz, originating from the capacitance formed by the pad electrode 13a. In other words, the magnitude of attenuation of a signal passing through the semiconductor device becomes substantially equal to the magnitude of attenuation of a signal reflected at an input/output terminal.

Furthermore, when the frequency of a signal increases up to around 280 GHz, the S-parameters $S_{11}$ and $S_{22}$ become larger than the S-parameter $S_{21}$, in other words, a signal passing through the semiconductor device becomes smaller than a signal reflected from the input/output terminal.

This indicates that a substantial portion (e.g., about three-fourth) of a signal input from the pad electrode 13a is reflected and the remainder (e.g., about one-fourth) of the signal is actually processed by the semiconductor device and output, e.g., for the signal of 280 GHz.

Thus, arranging the GND shield 11 in the lower layer of the pad electrode 13a causes the deterioration of a high frequency characteristic by the capacitance, e.g., between the pad electrode 13a and the GND shield 11.

Figure 5A:
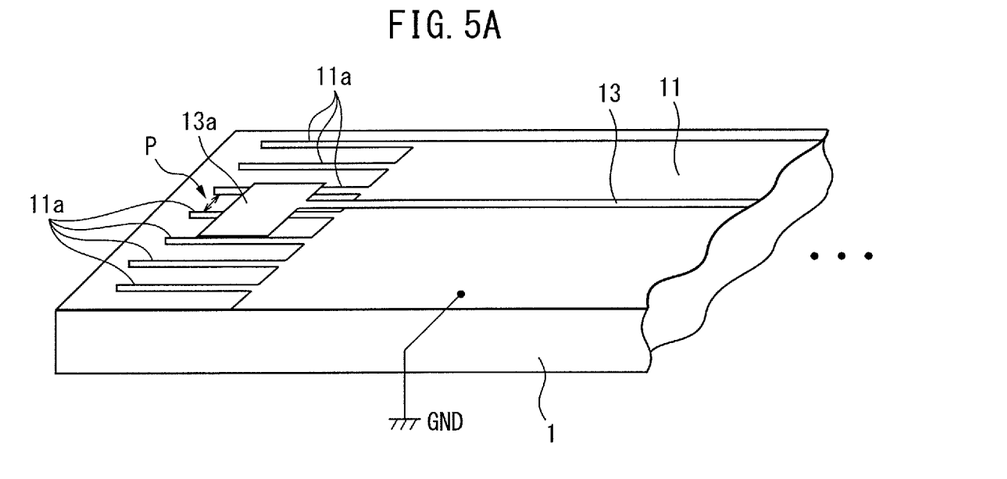
FIGS. 5A and 5B are explanatory diagrams for a semiconductor device of a first embodiment.
Figure 5B:
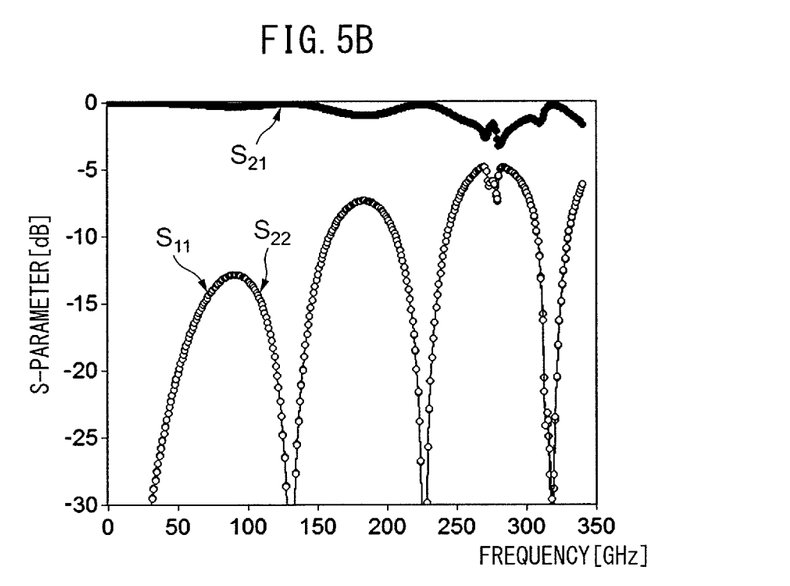

Hereinafter, a semiconductor device of the present embodiment will be described in detail with reference to the accompanying drawings. FIGS. 5A and 5B are explanatory diagrams for the semiconductor device of a first embodiment. FIG. 5A depicts a perspective view, and FIG. 5B depicts an example of the dependence of each S-parameter vs. frequency in a GND shield structure depicted in FIG. 5A. FIG. 5A depicts a part (end part) of a semiconductor substrate (substrate) 1.

As is apparent from a comparison between FIG. 5A and FIG. 4A, in the semiconductor device of the first embodiment, a GND shield 11, on which a ground (GND) electrical potential by a metal wiring layer on the substrate 1 is applied, is formed in a slit shape (reed shape) in the periphery of the substrate 1 on which a pad electrode 13a is provided.

The slit parts lie of the GND shield 11 may not be formed, e.g., on all the periphery of the substrate 1 on which the input/output pad electrode is arranged, but may be formed on an area corresponding to the pad electrode 13a, and a solid shape one may be formed on other area.

The GND shield 11 corresponding to the pad electrode 13a is made into the slit shape (the slit parts) 11a, such that a longitudinal direction of a slit is in parallel to a direction in which the signal proceeds in the pad electrode 13a. In other words, the longitudinal direction of the slit parts 11a of the GND shield 11 is in agreement with a direction in which a signal wiring 13, which connects to the pad electrode 13a, extends from the pad electrode 13a.

In addition, between the wiring 13 and the pad electrode 13a, and the GND shield 11 and the slit part 11a, e.g., an insulating layer 12 is provided, as depicted in FIG. 3A mentioned above. The thickness d of the insulating layer 12 is one-fourth of a signal wavelength or less.

Furthermore, a pitch P between each of the slit parts 11a of the GND shield 11 is also one-fourth of the signal wavelength or less. Note that the wavelength (length per one wave) of a signal corresponds to a value that is obtained, e.g., when a velocity at which the signal is propagated on the substrate 1 is divided by the frequency of the signal.

In this way, e.g., by making the shape of the GND shield 11 (11a), which corresponds to the pad electrode (planar electrode part) 13a with a prescribed area for an input pad and the like, into a slit shape, a good band characteristic (propagation characteristic) may be obtained.

In other words, as is apparent from a comparison between FIG. 5B and the above-mentioned FIG. 4B, according to the semiconductor device of the first embodiment depicted in FIG. 5A, e.g., even at around 180 GHz and 280 GHz, the S-parameter $S_{21}$ is sufficiently larger than the S-parameters $S_{11}$ and $S_{22}$.

Conceivably, this is because an electric field is generated between the pad electrode 13a and the slit parts 11a of the GND shield 11 and the leakage of a signal (RF signal) to the substrate 1 may be reduced.

Furthermore, in comparison with the case where complete shielding is performed with the GND shield 11 as described with reference to FIGS. 4A and 4B, the capacitance may be reduced by decreasing an area opposite to the pad electrode 13a, and the deterioration of a high frequency characteristic may be suppressed. Accordingly, it is understandable that the semiconductor device of the first embodiment is usable in all the bands, e.g., of the signal frequency of 0 to 350 GHz.

Figure 6A:
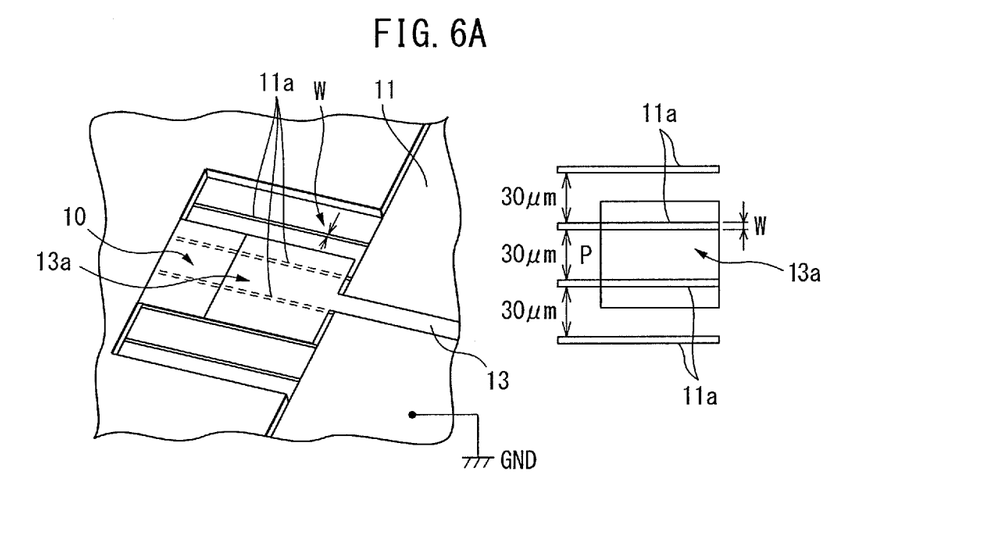
FIGS. 6A and 6B are diagrams for depicting a pad electrode part and an example of the dependence of each S-parameter vs. frequency, respectively, in the semiconductor device depicted in FIGS. 5A and 5B.
Figure 6B:
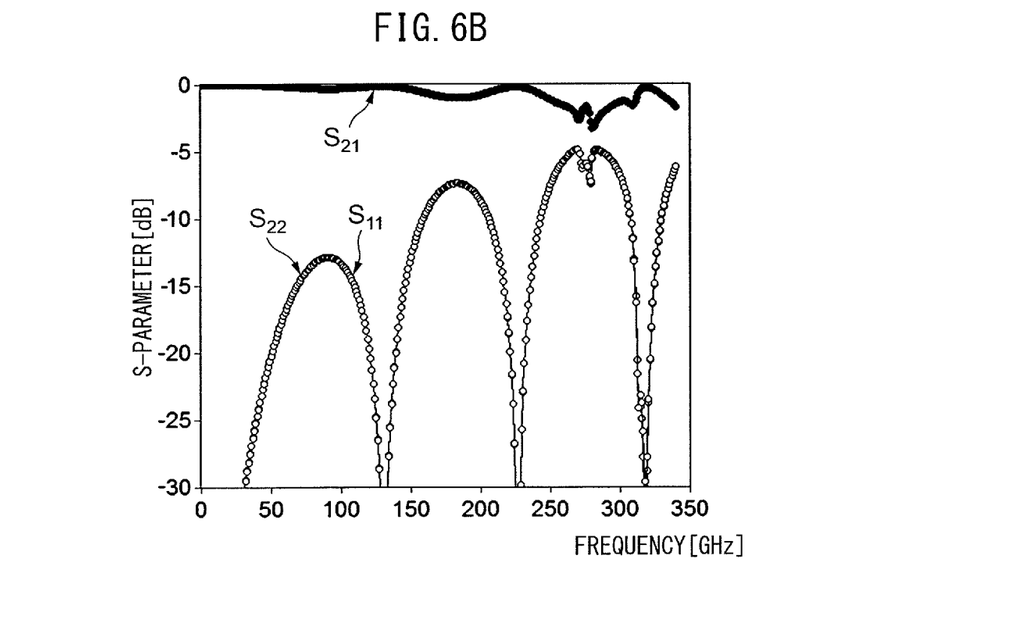
Figure 7A:
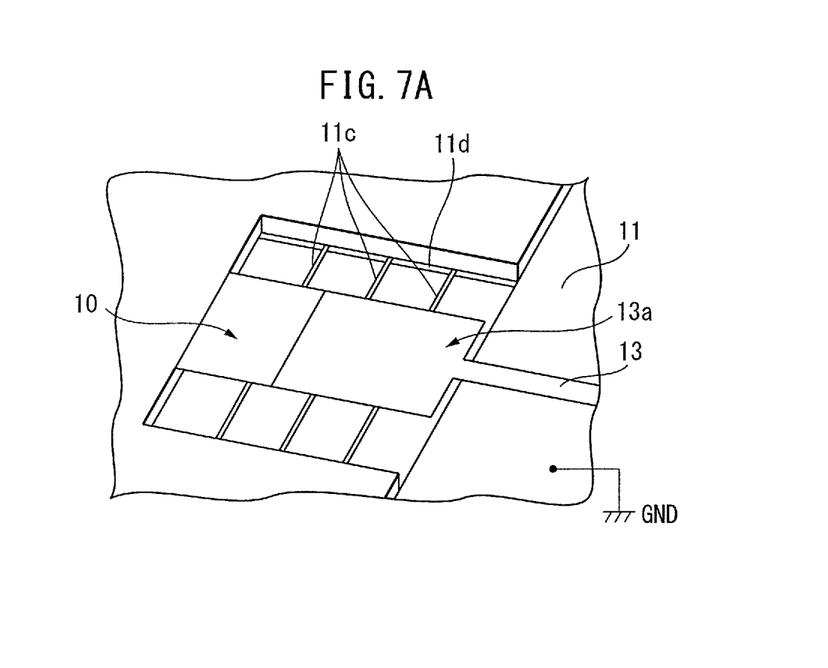
FIGS. 7A and 7B are diagrams for depicting a pad electrode part and an example of the dependence of each S-parameter vs. frequency, respectively, in a semiconductor device for comparison.
Figure 7B:
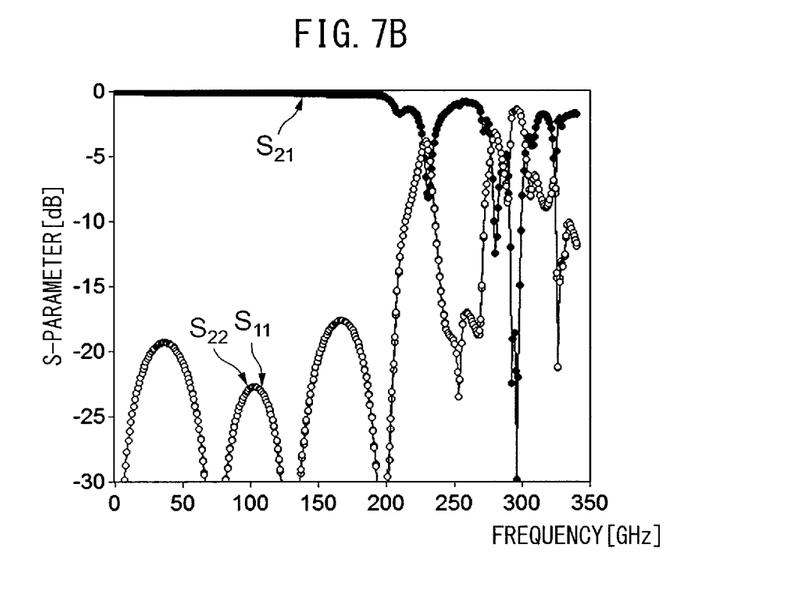

FIGS. 6A and 6B depict a pad part and an example of the dependence of each S-parameter vs. frequency, respectively, in the semiconductor device depicted in FIGS. 5A and 5B. FIGS. 7A and 7B depict a pad part and an example of the dependence of each S-parameter vs. frequency, respectively, in a semiconductor device for comparison.

FIGS. 6A and 6B depict a case where the longitudinal direction of the slit parts 11a of the GND shield 11 is in agreement with a direction in which a signal proceeds in the pad electrode 13a, as is the case of FIGS. 5A and 5B mentioned above. FIG. 6A depicts the shape of the slit parts 11a, and FIG. 6B depicts an example of the dependence of each S-parameter vs. frequency in that case.

FIGS. 7A and 7B depict a case where the longitudinal direction of the slit parts 11a of the GND shield 11 is perpendicular to a direction in which a signal proceeds in the pad electrode 13a. FIG. 7A depicts the shape of the slit parts 11a, and FIG. 7B depicts an example of the dependence of each S-parameter vs. frequency in that case. Note that in FIG. 7A, a plurality of slits 11c are connected with the GND shield 11, e.g., by a connecting wiring 11d, receiving a same electrical potential (GND-level electrical potential).

How the S-parameters change in FIG. 6B was obtained from a simulation, e.g., by setting a distance P between the neighboring slit parts 11a (a pitch between each of the slits) at 30 μm and the width W of one slit part 11a at 1 μm, as depicted in FIG. 6A.

The values of 30 μm as the pitch P between the slits and of 1 μm as the slit width W, and the like mentioned above are mere examples, and it is needless to say that various modifications and variations are possible according to the band of a signal that is used.

Reference sign 10 denotes a signal supply pad in FIGS. 6B and 7B, and supplying a signal from the signal supply pad 10 causes the signal to flow (proceed) from the signal supply pad 10 toward the signal wiring 13 in the pad electrode 13a.

As is apparent from a comparison between FIG. 6B and FIG. 7B, with respect to a slit at a position corresponding to the pad electrode 13a, when the longitudinal direction of the slit is parallel to (in agreement with) a direction in which the signal proceeds, a good characteristic is obtained; when the longitudinal direction of the slit is perpendicular to the direction in which the signal proceeds, there appears a deterioration in the characteristic.

Thus, understandably, a shielding effect may be confirmed when the direction of the slit parts 11a of the GND shield 11 is in agreement with the direction in which the signal proceeds in the pad electrode 13a, but the shielding effect may not be confirmed when the direction of the slit part 11a is perpendicular to the direction in which the signal proceeds.

In this way, the slit parts 11a of the GND shield 11 and preferably formed so that that the direction thereof is in agreement with (in parallel with) the direction in which the signal proceeds in the pad electrode 13a.

Figure 8:
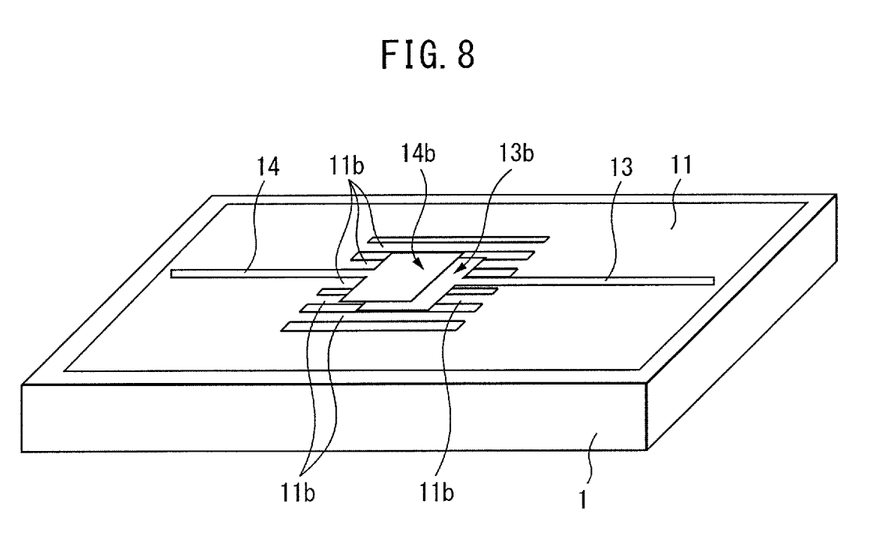
FIG. 8 is an explanatory diagram for a semiconductor device of a second embodiment.

FIG. 8 is an explanatory diagram for the semiconductor device of a second embodiment, depicting an example in which a capacitance such as an MIM (Metal-Insulator-Metal) capacitor is formed on a substrate 1 by pad electrodes (planar electrode parts) 13b and 14b of two wirings 13 and 14 provided in parallel with each other.

Needless to say, an insulating layer (dielectric layer) is provided between the pad electrode 13b and the pad electrode 14b, and a capacitance is formed by a structure in which the insulating layer is sandwiched by two electrodes 13b and 14b.

As depicted in FIG. 8, when a capacitance is formed on the substrate 1, by making the shape of the GND shield 11 which corresponds to the pad electrode 13b (14b) into a slit shape (slit parts) 11b, the direction of which is parallel to a direction in which a signal proceeds, a band characteristic may be improved.

In the above, the pad electrodes 13a, 13b and 14b are not limited to a pad electrode which forms an input/output pad and a capacitance in a semiconductor device, but may be broadly applied to an electrode part, e.g., with a larger area as compared with a wiring width.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a first electrode formed on a substrate, the first electrode being a first electrical potential;
    a second electrode formed on the first electrode, the second electrode including a signal wiring electrode part configured to transmit a signal and a planar electrode part with a prescribed area;
    a first insulating layer formed between the first electrode and the second electrode;
    a third electrode formed on the second electrode via a second insulating layer, wherein
        a shape of the first electrode opposite to the planar electrode part is made into a slit shape formed by a plurality of slits, a longitudinal direction of the slit being parallel to a direction in which the signal proceeds in the signal wiring electrode part,
        the planar electrode part is one of two capacitance electrodes which form a capacitance in the semiconductor device, and
        the third electrode includes a planar electrode part which is the other of the two capacitance electrodes opposite to the planar electrode part.

2. The semiconductor device according to claim 1, wherein a shape of the first electrode not opposite to the planar electrode part is made into a solid shape including the same thickness as that of the first electrode opposite to the planar electrode part.

3. The semiconductor device according to claim 1, wherein the first electrode and the second electrode are provided in a metal wiring layer.

4. The semiconductor device according to claim 1, wherein the first electrical potential is a ground electrical potential.

5. The semiconductor device according to claim 1, wherein
    the signal transmitted by the signal wiring electrode part and processed by the semiconductor device is an ultra-high frequency signal of a first wavelength, and
    a pitch between each of the slits in the first electrode, a shape of which is made into the slit shape opposite to the planar electrode part, is one-fourth of the first wavelength of the signal or less.

6. The semiconductor device according to claim 1, wherein a thickness of the first insulating layer is one-fourth of the first wavelength of the signal or less.

7. The semiconductor device according to claim 1, wherein the planar electrode part is an input pad for inputting the signal into the semiconductor device.

8. The semiconductor device according to claim 5, wherein
    a frequency of the signal transmitted by the signal wiring electrode part and processed by the semiconductor device is determined from 100 GHz to 350 GHz.

9. The semiconductor device according to claim 5, wherein
    the pitch between each of the slits in the first electrode is determined about 30 μm, and
    a width of each of the slits in the first electrode is determined about 1 μm.

* * * * *